(12) United States Patent
Di Stefano et al.

(10) Patent No.: US 11,431,115 B2
(45) Date of Patent: Aug. 30, 2022

(54) CONNECTORS FOR INTERCONNECTING MICROELECTRONIC CIRCUITS

(71) Applicant: Centipede Systems, Inc., San Jose, CA (US)

(72) Inventors: Thomas H. Di Stefano, San Jose, CA (US); Peter T. Di Stefano, San Francisco, CA (US)

(73) Assignee: Centipede Systems, Inc., San Jose, CA (US)

( * ) Notice: Subject to any disclaimer, the term of this patent is extended or adjusted under 35 U.S.C. 154(b) by 4 days.

(21) Appl. No.: 17/147,225

(22) Filed: Jan. 12, 2021

(65) Prior Publication Data

US 2021/0257758 A1 Aug. 19, 2021

Related U.S. Application Data

(60) Provisional application No. 62/995,831, filed on Feb. 15, 2020.

(51) Int. Cl.
| | |
|---|---|
| *H05K 1/11* | (2006.01) |
| *H01R 12/52* | (2011.01) |
| *H01L 23/00* | (2006.01) |
| *H01R 12/71* | (2011.01) |

(52) U.S. Cl.
CPC .......... *H01R 12/523* (2013.01); *H01L 24/32* (2013.01); *H01L 24/72* (2013.01); *H01L 24/73* (2013.01); *H01R 12/71* (2013.01); *H05K 1/116* (2013.01); *H01L 2224/32145* (2013.01); *H01L 2224/32225* (2013.01); *H01L 2224/72* (2013.01); *H01L 2224/73251* (2013.01); *H05K 2201/10242* (2013.01); *H05K 2201/10257* (2013.01); *H05K 2201/10265* (2013.01); *H05K 2201/10303* (2013.01)

(58) Field of Classification Search
CPC ................. H05K 5/0069; H05K 1/116; H05K 2201/10242; H05K 2201/10257; H05K 2201/10265; H05K 2201/10303; H01R 12/523; H01L 24/32; H01L 24/72; H01L 24/73; H01L 2224/32145; H01L 2224/72
See application file for complete search history.

(56) References Cited

U.S. PATENT DOCUMENTS

| | | | |
|---|---|---|---|
| 7,393,214 B2 | 7/2008 | DiStefano | |
| 7,402,051 B1* | 7/2008 | Batish | H01R 12/52 439/91 |
| 7,442,045 B1 | 10/2008 | Di Stefano | |
| D595,651 S | 7/2009 | Di Stefano | |
| D595,653 S | 7/2009 | Di Stefano | |
| 7,559,770 B2 | 7/2009 | Di Stefano | |
| 7,601,009 B2 | 10/2009 | Di Stefano | |
| 7,674,113 B2 | 3/2010 | Di Stefano | |
| 7,833,023 B2 | 11/2010 | Di Stefano | |
| 7,837,476 B2 | 11/2010 | Di Stefano | |

(Continued)

*Primary Examiner* — Hoa C Nguyen
(74) *Attorney, Agent, or Firm* — Michael B. Einschlag

(57) ABSTRACT

A connector includes a metal cylinder with three or more slots cut from a first end and three or more slots cut from a second end which are intercalated between the slots from the first end, whereby the connector is radially compressible along its entire length. The connector is adapted for insertion at one end into a hole in a circuit board, thereby making electrical contact to traces in the circuit board.

20 Claims, 5 Drawing Sheets

(56) References Cited

U.S. PATENT DOCUMENTS

| | | | |
|---|---|---|---|
| 7,955,088 B2 * | 6/2011 | Di Stefano | H01R 13/24 |
| | | | 439/82 |
| 7,980,862 B2 | 7/2011 | Di Stefano | |
| 7,985,077 B2 | 7/2011 | Di Stefano | |
| 8,033,877 B2 | 10/2011 | Di Stefano | |
| 10,041,974 B2 * | 8/2018 | Li | G01R 1/06722 |
| 2019/0150296 A1 * | 5/2019 | Southworth | H01P 1/047 |
| | | | 361/807 |

* cited by examiner

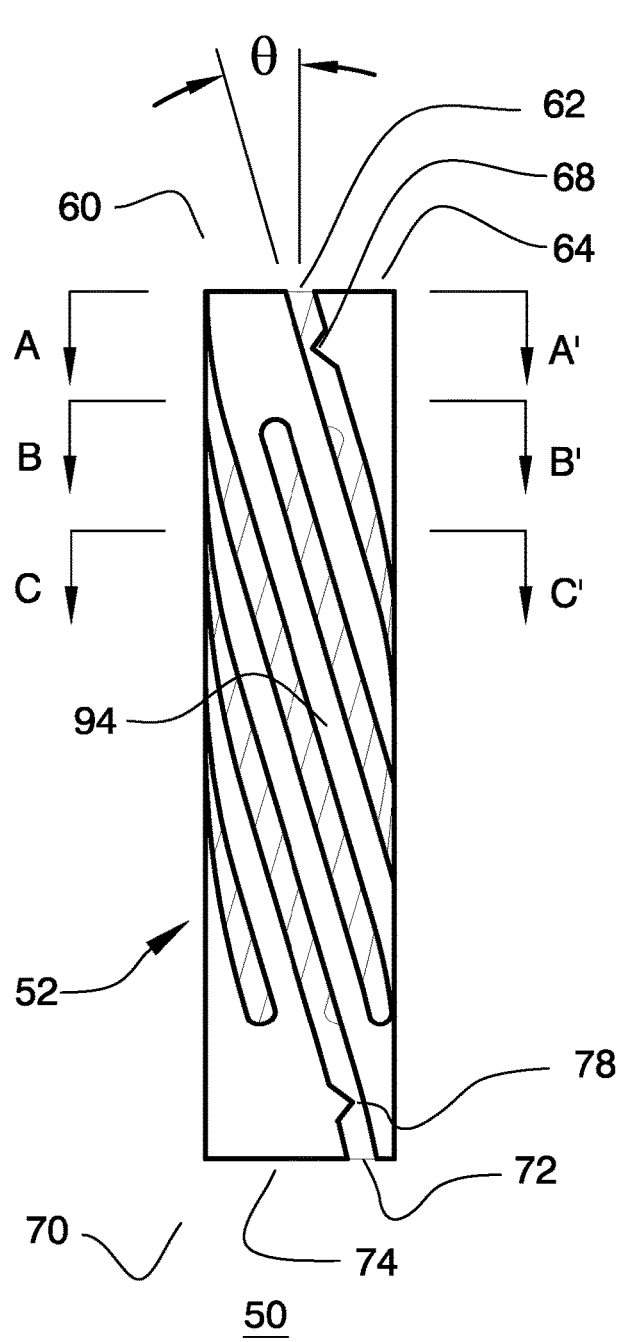
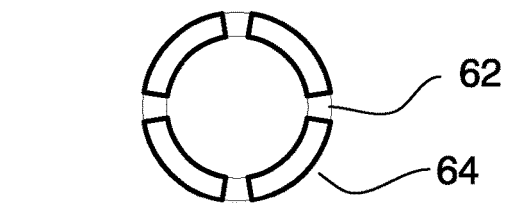
VIEW A-A'
*FIG. 2B*
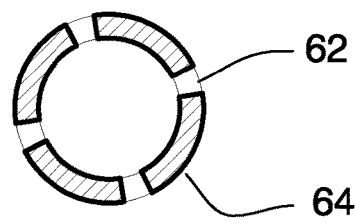
SECTION B - B'
*FIG. 2C*
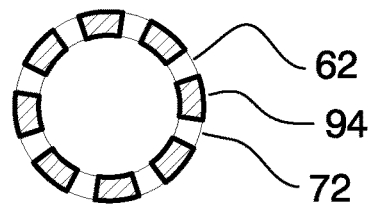
SECTION C - C'
*FIG. 2D*
*FIG. 2A*

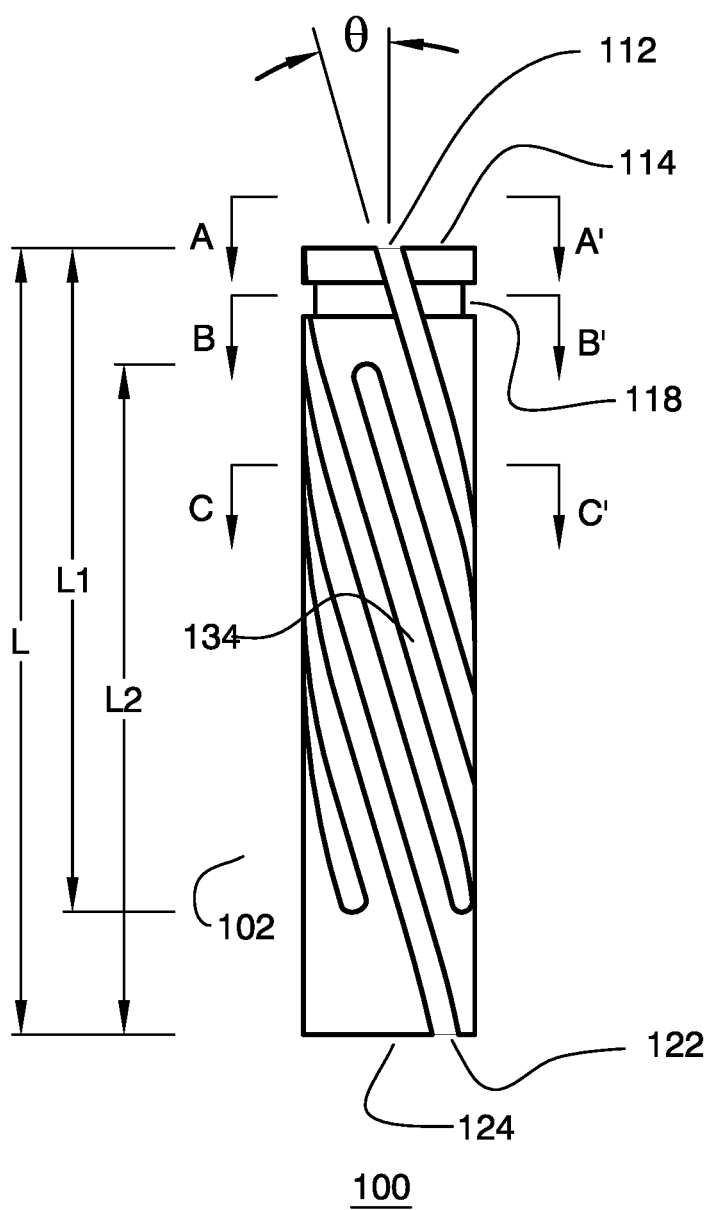
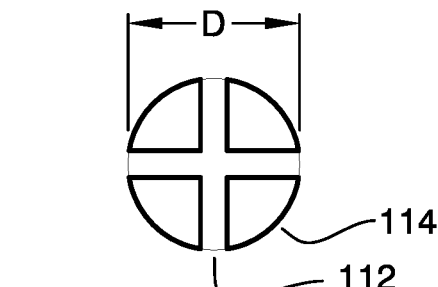
VIEW A-A'
FIG. 3B
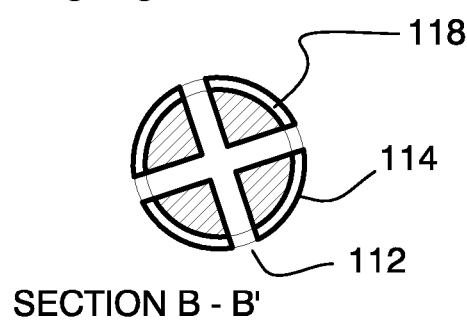
SECTION B - B'
FIG. 3C
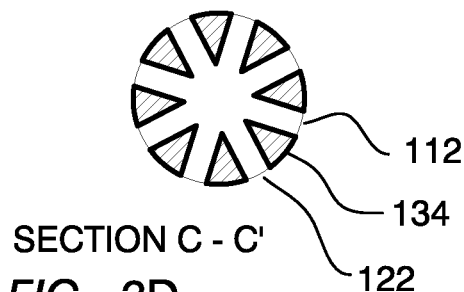
SECTION C - C'
FIG. 3D
FIG. 3A

CONNECTORS FOR INTERCONNECTING MICROELECTRONIC CIRCUITS

This patent application relates to U.S. Provisional Application No. 62/995,831 filed Feb. 15, 2020 from which priority is claimed under 35 USC § 119(e), and which provisional application is incorporated herein in its entirety.

TECHNICAL FIELD

One or more embodiments relate to connectors, for example and without limitation, for making connections, for example and without limitation, between microelectronic circuits such as, for example and without limitation, circuit boards, integrated circuits ("ICs"), cables, and flexible cables. More particularly, one or more embodiments relate to miniature electrical connectors such as, for example and without limitation, tubular connectors adapted for making connections between a circuit board and a mating IC— including, also without limitation, microprocessors, multi-chip modules, chips for peripheral functions and random access memories (RAM). More particularly, one or more embodiments relate to connectors adapted to making connections between circuits in a first electronic device and corresponding circuits in a second electronic device. Further, one or more embodiments relate to connectors adapted for making electrical connections between circuits on a cable and corresponding circuits on a mating microelectronic device.

BACKGROUND

Connectors are used widely in electronics to interconnect microelectronic circuits such as semiconductor integrated circuits (ICs), printed circuit boards, system boards, backplanes, and cables of various sorts. A socket is a type of connector used to connect terminals on an electronic device to corresponding contacts on a printed circuit board or other electrical interconnection apparatus. Sockets are often arranged in an array of elements that are intended to engage elements of a terminal array. In addition, sockets are routinely used in systems for: (a) testing electronic device performance (an assortment of types of sockets has been developed to connect to a device under test ("DUT") having a wide variety of terminals and configurations); or (b) burn-in of electronic devices at elevated temperatures. A cable connector is typically used to connect an array of terminals on an electrical cable to a group of corresponding electrical terminals or other conductors. Backplane connectors and inter-board connectors are typically used to connect an array of terminals on one printed circuit board to a corresponding array of terminals on another printed circuit board.

Advances in the size, density and speed of electronic devices are placing additional demands on connectors. In particular, a continuing increase in the wiring density of electronic systems requires a corresponding advance in the density of connectors as determined by the number of contacts per unit volume. Further, at higher frequencies and clock speeds, the size and self-inductance of connectors are becoming an important limitation to system performance. In addition to a lower inductance, advances in impedance control and shielding are required for future electronic systems. More specifically, interconnection elements are needed to support the performance requirements of 5G communication systems.

Prior art connectors are differentiated typically according to contactor type and intended use (i.e., application). As such, connectors used in applications in sockets are typically specifically designed to make electrical contact to microelectronic devices having specific types of device terminals. For example, specific types of device terminals contacted by sockets include pin grid arrays ("PGAs"), J-leads, gull-wing leads, dual in-line ("DIP") leads, ball grid arrays ("BGAs"), column grid arrays ("CGAs"), flat metal pads, land grid arrays ("LGAs"), and many others known in the art. A plethora of contactor technologies have been developed to provide sockets for microelectronic devices having this variety of terminals.

In addition to the foregoing, further differentiation among prior art sockets refers to low insertion force ("LIF") sockets, zero insertion force ("ZIF") sockets, auto-load sockets, burn-in sockets, high performance test sockets, and production sockets (i.e., sockets for use in products). In further addition to the foregoing, low-cost prior art sockets for burn-in and product applications typically incorporate contactors of stamped and formed springs that are adapted to connect to terminals on a device under test ("DUT"). In still further addition to the foregoing, for high pin-count, prior art sockets, a cam is often used to urge device terminals laterally against corresponding contactors to make good contact to each terminal while allowing low or zero insertion force.

For specialized applications, prior art sockets have used a wide variety of contactors, including anisotropic conductive sheets, flat springs, lithographically formed springs, fuzz buttons (available from Cinch, Inc. of Lombard, Ill.), spring wires, barrel connectors, and spring forks, among others. Prior art sockets intended for applications where many test mating cycles (also referred to as socket mount-demount cycles) are required typically use spring pin contactors (also referred to as spring probes or spring contacts) of the type exemplified by Pogo® spring contacts (available from Everett Charles Technologies of Pomona, Calif.).

Spring probes for applications in the electronics test industry are available in many configurations, including simple pins and coaxially grounded pins. Most prior art spring probes consist of a helical wire spring disposed between a top post (for contacting terminals on a DUT) and a bottom post (for contacting contacts on a circuit board—a device under test board or "DUT board").

Prior art sockets typically have a plurality of contactors disposed in an array of apertures formed through a dielectric holder. By way of example, a high performance, prior art test socket may incorporate a plurality of Pogo® spring contacts, each of which is held in a pin holder with an array of holes through a thin dielectric plate. The dielectric material in a high performance, prior art test socket is typically selected from a group of dimensionally stable polymer materials including: glass reinforced Torlon 5530 available from Quadrant Engineering Plastic Products, Inc. of Reading, Pa.; Vespel; Ultem 2000 available from GE Company GE Plastics of Pittsfield, Mass.; PEEK; liquid crystal polymer; and others. Individual Pogo® spring contacts are typically selected and designed for signal conduction at an impedance level of approximately fifty (50) ohms. In certain high performance, prior art configurations, the contactor is a coaxial type contactor having a center spring pin with a contactor barrel body enclosed within a cylindrical, coaxial, ground shield spaced to achieve a desired signal impedance, typically fifty (50) ohms.

Connectors used in applications for connecting one printed circuit board to another printed circuit board can be classified by type, including: edge connectors; pin-in-barrel connectors; stamped spring connectors; spring fork connectors; LAN-grid array connectors; conductive elastomeric connectors; and various other types known in the art.

Cable connectors adapted to flat cables are generally similar to printed circuit board to printed circuit board connectors with an added feature that one side of a connection is made to a flex cable or a flat array of wires rather than to a printed circuit board. Cable connectors adapted to a round bundle of wires are generally of the type employing a pin in barrel wherein a spring in the barrel retains the pin and applies a lateral force on the pin to establish reliable electrical contact. The spring incorporated into the barrel element may be a spring insert, a bundle of spring wires or an integral spring in the barrel.

The class of connectors used for socketing ICs is specialized and important in the electronics industry. The recent growth in use of BGA terminals for IC packaging has resulted in use of new and varied sockets adapted to BGA terminals for increasing terminal count and area density. BGA sockets have evolved in several directions. One type of BGA socket involves use of a cam driven spring wire to contact the side of each ball. In another type of BGA socket, spring pins or Pogo® pins have been adapted for use in such BGA sockets for certain applications in which the high cost of a socket is acceptable.

Low-cost BGA sockets for mass market applications have evolved the use of stamped and formed springs that cradle each ball of the BGA and provide some measure of mechanical compliance needed to urge a spring connector into contact with a mating ball. In such sockets, variations of stamped and formed springs are configured to use two or more formed springs to grip each ball, and thereby, to make positive electrical contact while retaining the ball mechanically without a need for a large vertical force to maintain contact to the ball. However, miniaturization and density of mechanically stamped and formed springs are limited to a certain size by present manufacturing capabilities. Although advances continue to be made in the manufacturing art of stamping and forming springs, sockets with contactors thusly made are limited in density by the complexity of stamping and forming very small miniaturized springs. Further, the mechanical compliance of a stamped and formed spring is typically small in a vertical direction, i.e., perpendicular to a substrate of a ball. Because of small compliance in the vertical direction, a miniature stamped and formed spring may be unable to accommodate motion of a contactor support relative to a ball mated to it, thereby allowing vibration, mechanical shock load and forces, flexure, and the like to cause the connector to slide over the surface of the ball. It is known in the industry that repeated microscopic motion of one contact relative to a mating contact causes fritting or a build-up of small particle debris that can lead to contact failure.

Stamped and formed spring contacts are typically held in an array of shaped through holes in a molded plastic housing to form a connector assembly. As connector assemblies are miniaturized, the molding and assembly processes become increasingly difficult and costly, thereby limiting the extension of connectors based on formed spring contacts to higher densities.

BGA sockets have also been constructed with contactors that make electrical contact to a bottom region of a ball by means of bundles of helical wires, wires in elastomeric material, cantilever springs, lithographically formed flat springs and other contactors that apply force vertically to a mating ball. The vertical force is necessary to make a good connection between a ball of a BGA and such force is significant for BGA packages with a large number of balls or bumps. For example, the clamping force for a BGA socket that applies force vertically to 1200 contact bumps is as high as 30 Kg to achieve adequate contact to each of the contact bumps. The clamping force needed by BGA sockets that make contact by applying force vertically is an increasing problem as the number of contact bumps increases into the thousands.

Electrical performance at high frequencies is being increasingly limited by the physical length, and associated inductance and capacitance of the connectors used to interconnect circuit elements. BGA sockets are limited by the size of spring elements needed to contact the balls, as well as the height of the ball itself. LGA sockets require spring elements of significant length to make reliable contact between mating pads. PGA sockets incorporate spring elements of significant length, in addition to the pin length, that inhibit electrical performance. Sockets incorporating Pogo® pins require pins of a significant length in order to make reliable contact between circuit elements. In each class of prior art, a significant length is added to connections between circuits on one surface and corresponding circuits on a mating surface, thereby limiting electrical performance of the resulting microelectronic assembly.

As is well known to those of ordinary skill in the art, a primary function of prior art connectors is to provide reliable and repeatable electrical contact between electrical terminals without causing damage to either, over a product lifetime that involves repeated temperature cycles, mechanical shock, vibration and flexure. As such, contact resistance is one measure of reliability of a connector as determined as a function of a number of temperature cycles, a number of drops, a number of flexures and a G-force level of vibration. As the size and spacing of terminals on microelectronic devices continue to be miniaturized, maintaining contact between the terminals and socket contactors is proving increasingly difficult. Conventional sockets that rely upon frictional forces to retain the microelectronic device in the socket cannot easily be extended to terminal densities projected for the future. Improvements in socket technology are needed to provide reliable connections to increasingly miniaturized microelectronic circuits. Further improvements in socket technology are needed to meet requirements for increased performance of future electronic systems, and in particular, 5G communications systems.

SUMMARY

In accordance with one or more embodiments, a connector is provided, for example and without limitation, for making electrical connections between terminal holes on a microelectronic circuit and corresponding terminal holes on a mating microelectronic circuit, and for mechanically retaining the circuits, one to another. In one embodiment, a tubular connector, compressible in a radial direction along its axial length, is adapted for making electrical connection between a conductive hole in a first circuit and a corresponding conductive hole in a second circuit. In use, the connector is radially compressed by inserting it into a hole in the first circuit and by inserting it into a hole in the second circuit. As a result, the first circuit may be juxtaposed to the second circuit, for example and without limitation, with a minimum of separation therebetween. Further, radial forces urge the connector against a wall of the hole in the first circuit, and urge the connector against a wall of the hole in the second circuit, thereby acting to hold the first and the second circuit together, for example and without limitation, against vibrational forces, mechanical shock, and thermal transients. In accordance with one or more embodiments, the connector comprises: (a) a conductive body with a wall having a cylindrical surface; (b) a plurality of first slots that perforate, i.e., cut through, the wall and extend from a first end of the body partway toward a second end of the body; and (c) a plurality of second slots that perforate, i.e., cut through, the wall and extend from the second end of the body toward the first end of the body and which second slots are intercalated between the first slots.

BRIEF DESCRIPTION OF THE DRAWINGS

FIG. 2A is an elevation view of a connector that is fabricated in accordance with one or more embodiments, which connector comprises a hollow tube having a plurality of slots extending from a top end partway toward a bottom end, which slots are intercalated between a plurality of slots extending from the bottom end partway to the top end.

FIG. 2B is a top view A-A' of the connector of FIG. 2A showing top ends of top segments of top tines, which top segments are separated from one another by slots cut through the wall of the tube, and which slots extend from the top end of the tube.

FIG. 2C is a top sectional view B-B' through the connector of FIG. 2A showing portions of top segments of top tines, which portions are separated from one another by slots cut through the wall of the tube, which slots extend from the top end of the tube.

FIG. 2D is a top sectional view C-C' through the connector of FIG. 2A showing: (a) slots cut through the wall of the tube, which slots extend from a top end of the tube; (b) slots cut through the wall of the tube, which slots extend from a bottom end of the tube; and (c) legs between the slots.

FIG. 3A is an elevation view of a connector that is fabricated in accordance with one or more embodiments, which connector is formed from a solid cylindrical body (for example and without limitation, a wire) that is: (a) cut through by a plurality of slots extending from a top end partway towards a bottom end; and (b) cut through by a plurality of slots extending from the bottom end partway to the top end.

FIG. 3B is a top view A-A' of the connector of FIG. 3A showing the top ends of four top segments of top tines, which top segments are separated from one another by slots extending from the top end of the connector.

FIG. 3C is a top sectional view B-B' through the connector of FIG. 3A showing a rasp and four top segments of top tines, which top segments are separated from one another by slots extending from the top end of the connector.

FIG. 3D is a top sectional view C-C' through the connector of FIG. 3A showing: (a) slots cut through the connector from the surface of a wire to the axis of the wire and extending from a top end of the connector; (b) slots cut through the connector from the surface of the wire to the axis of the wire and extending from a bottom end of the connector; and (c) legs between the slots.

DETAILED DESCRIPTION

In accordance with one or more embodiments, a connector is provided for use, for example and without limitation, in making electrical connections between microelectronic circuits. In particular, in accordance with one or more such embodiments, the connector is a connector for making electrical connection to microelectronic circuits, and in further particular, to microelectronic circuits with closely spaced terminals. As used herein, the term microelectronic circuits includes, for example and without limitation, integrated circuits ("ICs"), microprocessors, chips for peripheral functions, random access memories (RAM), flexible cables, circuit boards, printed circuit boards, and multi-chip modules. In accordance with one or more such embodiments, a self-retaining connector comprises a cylindrical metal tube with a plurality of slots that perforate the wall (i.e., they cut through the wall of the cylindrical metal tube completely), wherein the slots are disposed around the circumference of the tube in two intercalated groups. Thus, the term "cut through" here refers to a description of a slot in the sense that a slot is a perforation that extends completely through a wall of the tube rather referring to a processing step used to create the slot. A first group of the slots comprises slots that begin at a first end of the tube and extend partway toward a second end of the tube; and a second group of the slots comprises slots that begin at the second end of the tube and extend partway toward the first end of the tube.

Figure 1:
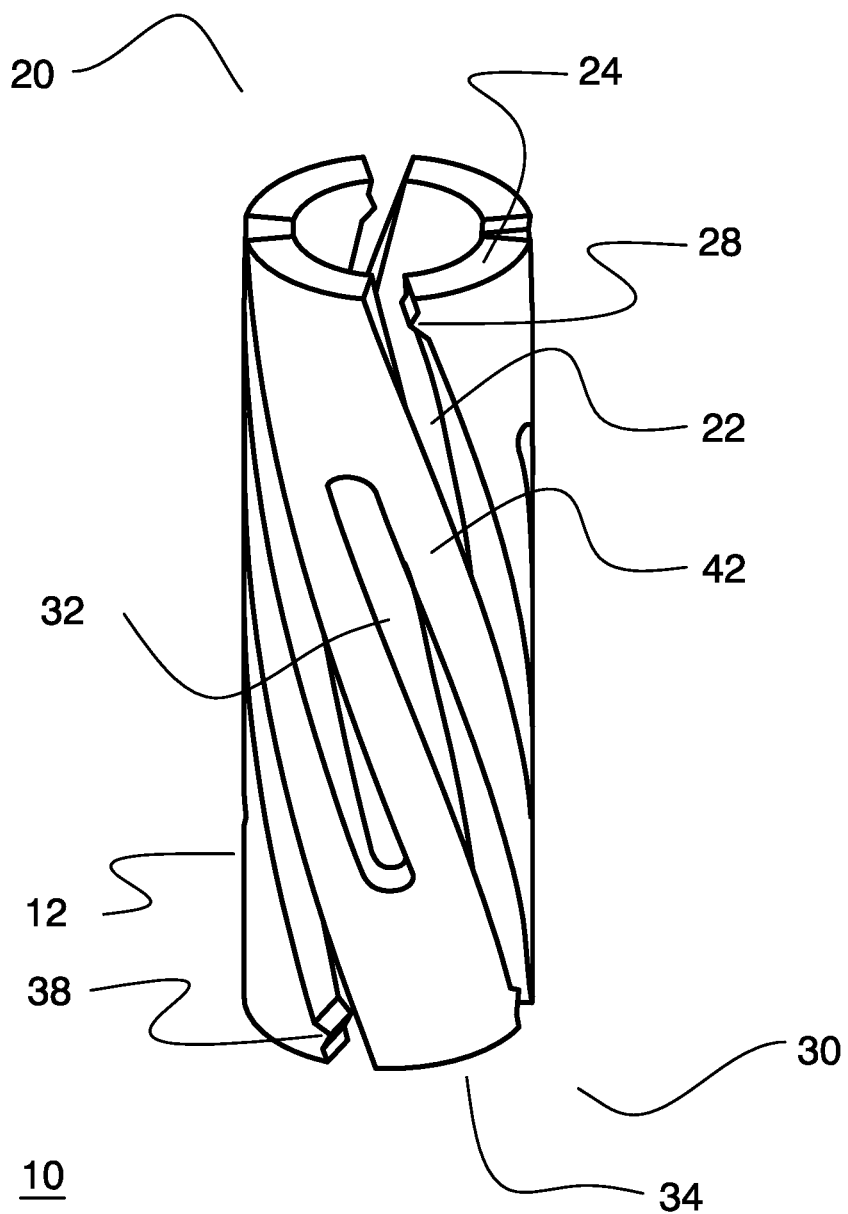
FIG. 1 is a perspective view of a connector that is fabricated in accordance with one or more embodiments, which connector comprises a hollow tube having a plurality of slots extending from a top end partway toward a bottom end, which slots are intercalated between a plurality of slots extending from the bottom end partway toward the top end.

FIG. 1 is a perspective view of connector 10 that is fabricated in accordance with one or more embodiments. In accordance with one or more such embodiments, connector 10 comprises electrically conductive, hollow, cylindrical tube 12 having: (a) a plurality of slots 22 cut through the wall of tube 12, wherein slots 22 extend from top end 20 of tube 12 partway toward bottom end 30 of tube 12; and (b) a plurality of slots 32 cut through the wall of tube 12, wherein slots 32 extend from bottom end 30 of tube 12 partway toward top end 20 of tube 12. Slots 22 and 32 are disposed around the circumference of connector 10, wherein slots 22 are intercalated between slots 32 to form a plurality of legs 42 disposed therebetween. Slots 22 extend for a length L1, as measured along the axial direction of tube 12, from top end 20, and slots 32 extend for a length L2, as measured along the axial direction of tube 12, from bottom end 30. The length L of tube 12 is measured along the axis of the tube. Thusly configured, slots 22 and slots 32 provide connector 10 with a radial compliance that allows elastic radial compression along the entire length of connector 10. Further, in accordance with one or more embodiments, such elastic radial compression may be, for example and without limitation, a substantial elastic radial compression (where a substantial elastic radial compression may be considered to be an elastic radial compression that is, for example and without limitation, orders of magnitude greater than the elastic radial compression of an uncut tube of the same: material, length, wall thickness and diameter, under identical radial urging).

As shown in FIG. 1, radially compliant connector 10 comprises an array of legs wherein: (a) each leg is connected, at a top end of the leg, to a top segment (like top segment 24) disposed at top end 20 of tube 12, which top segment is also connected to a top end of a first adjacent leg disposed along one side of the leg; and (b) each leg is connected, at a bottom end of the leg, to a bottom segment (like bottom segment 34) disposed at bottom end 30 of tube 12, which bottom segment is also connected to a bottom end of a second adjacent leg disposed along the other side of the leg. Thusly connected, the legs of the tube are connected, one to another, in a serpentine path, alternating between the two ends of the tube, wherein each leg and its associated first and second connected legs are elastically moveable in a radial direction by means of elastic distortion of legs in the array. Referring to FIG. 1, a top tine is comprised of two legs connected to a top segment and a bottom tine is comprised of two legs connected to a bottom segment. As can be seen from FIG. 1, a top tine shares one leg with a first bottom tine and it shares its other leg with a second bottom tine so that, in effect, the top tines and the bottom tines of tube 12 are connected, one to another, in a serpentine path, alternating between top end 20 and bottom end 30 of tube 12, wherein each top tine and each bottom tine are elastically moveable in a radial direction.

A fabrication methodology for one or more embodiments entails: (a) cutting a first array of slots from a proximal end of a hollow tube, the slots extending partway (at least 65% of the distance as measured along an axis of the tube) to a distal end of the tube; and (b) cutting a second array of slots from the distal end of the tube, the second array of slots extending partway (at least 65% of the distance as measured along the axis of the tube) to the proximal end of the tube, so that the slots of the first array of slots are intercalated between the slots of the second array of slots. Thus, it should be understood that the term "cutting" here refers to a description of a processing step used to create slots. As a result, a plurality of legs of substantially equal width, and of length of at least 30% of the length of the tube as measured along an axis of the tube are formed. In accordance with one or more such embodiments, the lengths of slots 22 and of slots 32 are preferentially selected to be within a range of $0.65<(L1/L)<0.98$ and $0.65<(L2/L)<0.98$, respectively; and, more preferentially, the lengths of slots 22 and of slots 32 are selected to be within a range of $0.8<(L1/L)<0.95$ and $0.8<(L2/L)<0.95$, respectively. Note that embodiments exist where L1 and L2 are different.

The following parameter may be useful as a rule of thumb in choosing dimensions for a connector embodiment (this parameter is referred to herein as an aspect ratio (AR)) where the angle between slots and the axis of the tube ($\Theta$) is the same angle for slots extending from the top and bottom ends (so as to form legs of substantially uniform width). This parameter: (a) is directly proportional to the length of the legs, i.e., $L1+L2-L$ (where L1 equals the length of slots extending from the top end of the tube as measured along the axis of the tube, L2 equals the length of slots extending from the bottom end of the tube as measured along the axis of the tube, and L equals the length of the tube); (b) is directly proportional to the number of legs N; (c) is inversely proportional to the circumference of the tube, i.e., $\pi^*D$ (where D is the outer diameter of the tube) and (d) increases as $\Theta$ increases. Thus, in general, when considering two sets of dimensions for an embodiment, it is preferred to choose the set of dimensions that increases AR. For example, for an arbitrary tube configuration, the parameter AR decreases with an increase in diameter D. Thus, where the other dimensions remain fixed, one would prefer designs that increased the number of legs with an increase in diameter D.

Referring to FIG. 2A, it is seen that the angle $\Theta$ of a slot is determined by its orientation relative to the axis or centerline of the tube. In accordance with one or more embodiments, angle $\Theta$ is selected (with reference to the length and diameter of a tube) so as to provide a leg that extends circumferentially in a range from about ⅓ to about ⅔ of the distance around the tube (i.e., a leg should only go partly around, and not all the way around, the tube). The angle $\Theta$ used to provide that the legs extend in this range depends upon the diameter and the length of the tube. In accordance with one or more embodiments, the angle of slot 22 with respect to the axis of the connector is preferentially between 5° and 45°, and, more preferentially, between 10° and 35° and the angle of slot 32 with respect to the axis of the connector is preferentially between 5° and 45°, and, more preferentially, is between 10° and 35°.

In accordance with one or more embodiments, there is no circumferential path of continuous material around the girth of tube 12 in connector 10. In other words, every cross section of tube 12 is segmented by three or more slots that allow such segments to be moved toward the axis of tube 12 by urging the segments radially toward the axis (as discussed below, this can be understood with reference to FIGS. 2B-2D). A radial urging causes the legs to flex elastically, allowing segments of the tube (i.e., top segments disposed at a top end and bottom segments disposed at a bottom end) to move radially in response to the urging. Hence, the tube is radially compliant at every section along the length of the tube.

Although slots 22 and 32 are shown in FIG. 1 as having a uniform width, further embodiments exist which include slots that are tapered along their length and/or slots that are irregularly shaped. For example, a slot may follow a curvilinear path, i.e., a path that curves around and along the axis, where angle $\Theta$ of the slot varies with distance along the length of the slot. In the embodiment shown in FIG. 2, slots 62 and 72 follow helical paths of uniform angle $\Theta$. It should be noted that, although the angles of such helical paths may be deemed to be uniform, due to fabrication tolerances, the uniform angles may be substantially uniform, i.e., they may vary by ±10%. For clarity of exposition, only one of slots 22, slots 32, top segments 24, bottom segments 34 and legs 42 are labeled in FIG. 1.

As used herein, the term slot means a cut that perforates (i.e., a cut that extends completely through) from the surface to the axis of a cylinder. As used herein: (a) top means in a direction toward a top of a sheet of paper upon which a figure is drawn, and correspondingly, bottom means in a direction toward a bottom of the sheet; (b) the terms tube and tubular refer to a cylindrical body that is hollow along at least a portion of its length; (c) the term wire refers to a solid cylindrical body, which body may have slots cut through from the surface to the axis of the cylinder; and (d) the term resilient means elastic or spring like and not taking a permanent set. In addition, it should be understood that, in accordance with one or more embodiments, the cylindrical body has straight walls along the whole or a portion of the body.

In accordance with one or more embodiments, slots 22 and slots 32 of connector 10 are intercalated so as to form a plurality of flexible legs 42 along a middle portion of connector 10. Connector 10 of FIG. 1 has four slots 22 extending from top end 20 and four slots 32 extending from bottom end 30, thereby forming eight resilient legs 42 of connector 10. Each pair of adjacent legs 42 is joined to a top segment 24 disposed at top end 20 to form a flexible top tine. Connector 10 of FIG. 1 has four flexible top tines and four flexible bottom times. In accordance with one or more embodiments, a plurality of intercalated slots are configured to provide radial compressibility along the axial length of the connector. The term radical compressibility means that the radius of a circle enclosing the girth of the connector is reduced by a force urging the surface of the connector inwardly toward the central axis of the connector. In addition, in accordance with one or more embodiments, a connector is configured with three or more pairs of intercalated slots.

In accordance with one or more embodiments, slots 22 and 32 follow a curvilinear paths (i.e., paths that curve around and along the axis of connector 10). Flexible legs 42, disposed between adjacent slots 22 and 32, are shown in FIG. 1 as curvilinear springs disposed around the axis of connector 10. In accordance with one or more further embodiments, depending upon the shape of the slots cut in the wall of the connector, the legs may not be identical in width and/or angle with respect to the axis of the tube. The angle of slot 22 with respect to the axis of the connector is preferentially between 5° and 45°, and, more preferentially, is between 10° and 35° and the angle of slot 32 with respect to the axis of the connector is preferentially between 5° and 45°, and, more preferentially, is between 10° and 35°. Referring to angle Θ in FIG. 2A, it is seen that the angle of a slot is determined by its orientation relative to the axis or centerline of the tube. In accordance with one or more embodiments, a slot of constant, non-zero angle along its length forms a helical slot. Thus, a helical slot is a particular type of curvilinear slot in that a helical slot follows a helical path (a curvilinear slot is a slot that follows a curvilinear path where a curvilinear path is a path that curves around and along the axis of the connector). Helical slots are preferred over straight slots of zero angle (for helical slots, angle Θ can be referred to as the angle of the slot or the angle of the helical path). For tapered slots, the angle of a slot is determined from a centerline of the slot. In use, a connector comprised of a tube with curvilinear slots may be used to contact a mated cylindrical hole at points the near the end of the tube. For example, near the end of a tube (whether a top end or a bottom end) is a distance from the end such that 0.0≤distance≤0.20*L, where L is the length of the tube.

In accordance with one or more embodiments, connector 10 may further include rasps 28 disposed, as shown in FIG. 1, on top tines (for example, as shown in FIG. 1, rasps 28 are disposed along the edge of slot 22 near top end 20 (where near top end 20 is a distance from top end 20 such that 0.0≤distance≤0.20*L, where L is the length of the tube), which rasps 28 are adapted to engage the surface of a cylindrical hole, for example and without limitation, a cylindrical metal hole in a circuit board (not shown in FIG. 1) that is mated, for example and without limitation, to end 20 of connector 10. In accordance with one or more such embodiments, rasps 28 may be disposed along the edges of top segment 24 and even along the edges of legs connected to top segment 24. In accordance with one or more embodiments, connector 10 may further include rasps 38 disposed, as shown in FIG. 1, on bottom tines (for example, as shown in FIG. 1, rasps 38 are disposed along the edge of slot 32 near bottom end 30 (where near bottom end 30 is a distance from bottom end 30 such that 0.0≤distance≤0.20*L, where L is the length of the tube), which rasps 38 are adapted to engage the surface of a cylindrical hole, for example and without limitation, a cylindrical metal hole in a circuit board (not shown in FIG. 1) that is mated, for example and without limitation, to end 30 of connector 10. Thus, in accordance with one or more such embodiments, rasps 38 may be disposed along the edges of bottom segment 34 and even along the edges of legs connected to bottom segment 34. In accordance with one or more such embodiments, in use, the rasps contact an interior surface of a mated cylindrical hole, which contact is caused by elastic deflection of the tube. For example, in an embodiment having helical slots, radial compression of the connector causes tines to be distorted torsionally, and thereby, to urge rasps thereon into contact with an interior surface of the mated cylindrical hole. In particular, radial compression of the connector causes a portion of a tine (for example, a segment) which was cut by helical slots at an end of the tube to rotate in a plane perpendicular to the axis of the tube (which rotation throws one edge of the segment outwardly toward the mated cylinder), thereby bringing one edge of the segment into contact with the interior surface of the mated cylindrical hole.

In accordance with one or more embodiments, a configuration of helical slots is preferred because such a configuration causes contacts between a tubular connector and mating cylindrical holes to occur near ends of the connector (where near ends is a distance from the ends such that 0.0≤distance≤0.20*L, where L is the length of the tube). Thus, when a configuration of helical slots provides contact between a first end of a tubular connector and a first cylindrical hole, the contact is made in a region near a first end of the connector. As a result of radial compression of the first end, the second end of the connector expands in the radial direction, thereby providing enhanced contact force between a second end of the connector and another mating cylindrical hole. This is contrasted with a tubular connector having straight, non-helical slots which will make contact with a first mating cylinder at points along the length of the connector, thereby compressing the connector along its length. Such compression may prevent contact with a second cylinder of larger diameter than the first where this may result in an unreliable contact between the tubular connector and the second cylinder.

In accordance with one or more such embodiments, either of rasps 28 or rasps 38 may be a multiplicity of rasps disposed along one or more of the segments and legs of tines and may have a shape of a sawtooth, a chisel edge, a spur, or other type of asperity adapted to positively engage the interior surface of a mated cylindrical hole by providing scraping contact. In accordance with one or more embodiments, rasps in slots near the end of the tube may be formed by undulations (for example and without limitation, a zigzag pattern) etched in the slot by laser machining. In addition, in accordance with one or more further embodiments, rasps may comprise, for example and without limitation: (a) one or more circumferential grooves in the surface of tube 12 (refer to FIG. 3A)—as long as the tube is thick enough to support such grooves; (b) a surface roughness etched into the surface of tube 12 near an end of the tube; (c) a granular material deposited on the surface of tube 12 near the end of the tube; or (d) asperities on the surface of tube 12 near the end of the tube that are fabricated using any one of a number of methods that are known in the art for creating asperities.

In accordance with one or more embodiments, a tubular connector may be fabricated of tubular elastic material with arrays of slots disposed therethrough. Suitable elastic materials may be selected from a group including, for example and without limitation, stainless steel, 17-7 stainless steel, Type 304 stainless steel, MP35N stainless steel, tool steel, tungsten alloys, diamond like carbon, silicon, and polyimide. For applications where the connectors are used to make electrical contact, the tubular connector may be coated with material selected to provide and/or improve electrical contact. Such materials known in the art include, for example and without limitation, gold, layers of nickel and hard gold, layers of cobalt-nickel and hard gold, and layers of copper, nickel and hard gold. Hard gold, as known in the art, includes alloys of gold, nickel, cobalt, chromium, silicon and other metals known in the art.

Embodiments of tubular connector 10 were made using hypodermic tubing of Type 304 stainless steel having an inner diameter of 440 microns and an outer diameter of 550 microns. Suitable such tubing stock material is available from K-Tube Corporation of Poway, Calif. Slots 22 and 32 were made through the wall of a tube by cutting along a length of the tube using a Nd-YAG laser. In practice, for example and without limitation, slots 22 and 32 may be cut to a width, for example and without limitation, of about 10 to about 200 microns by a laser cutting process. After laser cutting, the outer surface of the tube was plated with a 2 micron thick layer of nickel and a 1.5 micron thick layer of hard gold to form a conductive surface for contacting a mating cylindrical, metal plated hole.

The inventor discovered that the radial compressibility of embodiments of connector 10 (fabricated as described above) allowed the top end (end 20 of connector 10) to be inserted into a first plated hole of diameter 500 microns, wherein compression of the tube (tube 12 of connector 10) acted to retain the top end (end 20 of connector 10) in the mating hole. The plated hole was a plated hole in a printed circuit board. Radial compressibility of embodiments of connector 10 further allowed the bottom end (end 30 of connector 10) to be inserted and retained in a second plated hole of diameter 500 microns. The inventor further discovered that connectors with slots 22 and 32 cut at an angle with respect to the axis of the connector acted to retain the first hole mechanically to the second hole and to resist decoupling of the holes. It was found that a connector with slots disposed at an angle between 5° and 45° acted to retain the first and the second plated holes together reliably after the connector joined one to the other.

FIG. 2A is an elevation view of connector 50 that is fabricated in accordance with one or more embodiments. As shown in FIG. 2A, slots 62 and 72 cut through the wall of electrically conductive, hollow, cylindrical tube 52 where: (a) slots 62 begin at top end 60 of tube 52 and extend partway toward bottom end 70 of tube 52; and (b) slots 72 begin at bottom end 70 of tube 52 and extend partway toward top end 60 of tube 52. Slots 62 and slots 72 are: (a) intercalated so as to form flexible legs 94 disposed therebetween; and (b) oriented at an angle Θ with respect to the axis of tube 52. In accordance with one or more embodiments, angle Θ is preferentially between 5° and 45°, and, more preferentially, between 10° and 35°. In accordance with one or more embodiments, angle Θ is selected to achieve a desired retaining force, for example and without limitation, between circuit holes in two juxtaposed circuits which are co-joined by a connector of a specific diameter and length. For clarity of exposition, labels are drawn to only one of slots 62, slots 72, top segments 64, bottom segments 74, and legs 94. In accordance with one or more embodiments, the angles of slots 62 and of slots 72 are made equal in order to form legs of substantially uniform width.

In accordance with one or more embodiments, connector 50 may further include rasps 68 disposed, as shown in FIG. 2A, on top tines (for example, as shown in FIG. 2A, rasps 68 are disposed along the edge of slot 62 near top end 60 (where near top end 60 is a distance from top end 60 such that $0.0 \leq distance \leq 0.20*L$, where L is the length of the tube), which rasps 68 are adapted to engage the surface of a cylindrical hole, for example and without limitation, a cylindrical metal hole in a circuit board (not shown in FIG. 2A) that is mated to end 60 of connector 50. In accordance with one or more such embodiments, rasps 68 may be disposed along the edges of top segment 64 and even along the edges of legs connected to top segment 64. In accordance with one or more embodiments, connector 50 may further include rasps 78 disposed, as shown in FIG. 2A, on bottom tines (for example, as shown in FIG. 2A, rasps 78 are disposed along the edge of slot 72 near bottom end 30 (where near bottom end 70 is a distance from bottom end 70 such that $0.0 \leq distance \leq 0.20*L$, where L is the length of the tube), which rasps 78 are adapted to engage the surface of a cylindrical hole, for example and without limitation, a cylindrical metal hole in a circuit board (not shown in FIG. 2A) that is mated to end 70 of connector 50. Rasps 68 and 78 are positioned and fabricated like rasps 28 and 38 described above in conjunction with FIG. 1.

FIG. 2B is a top view A-A' of connector 50 showing top ends of top segments of top tines, which top segments are separated from one another by slots 62 cut through the wall of tube 52, and which slots 62 extend from top end 60 of tube 52. FIG. 2C is a top sectional view B-B' through connector 50 showing portions of top segments of top tines, which portions are separated from one another by slots 62 cut through the wall of tube 52, and which slots 62 extend from the top end of tube 52. FIG. 2D is a top sectional view C-C' through connector 50 showing: (a) slots 62 cut through the wall of tube 52, which slots 62 extend from top end 60 of tube 52; (b) slots 72 cut through the wall of tube 52, which slots 72 extend from bottom end 70 of tube 52; and (c) legs 94 between slots 62 and slots 72. Legs 94 comprise material directly between slots 62 extending from top end 60 of tube 52, and adjacent slots 72 extending from bottom end 70 of tube 52. In accordance with one or more embodiments, the width of legs 94 is substantially uniform along the length of the legs, and in accordance with one or more further embodiments, the width of each slot may taper along the length of the slot, thereby forming legs of tapered width. In order to provide radial resilience along the length of connector 50, the length of legs 94, as measured along the axis of tube 52, is preferably selected to be between 0.3 and 0.96 times the length of tube 52. Resilient flexure of legs 94 allows radial compression of connector 50, whereby the girth of connector 50 may be reduced along the entire length of the connector. As can be understood with reference to FIGS. 2B-2D, every cross section of tube 52 is segmented into portions by slots that allow such segmented portions to be moved toward the axis of the tube by urging the segmented portions radially toward the axis.

FIG. 3A is an elevation view of connector 100 that is fabricated in accordance with one or more embodiments. Connector 100 is formed from solid cylindrical body 102 (for example and without limitation, a wire) that is: (a) cut through by a plurality of slots 112 extending from a top end partway to a bottom end; and (b) cut through by a plurality of slots 122 extending from a bottom end partway to a top end. Slots 112 and 122 are disposed in an intercalated pattern around the circumference of cylindrical body 102, whereby thusly formed connector 100 is radially compressible along the entire length thereof. In other words, the diameter of radially compressible connector 100 is reducible by means of a radially directed force urging the cylindrical surface of wire 102 inwardly toward its axis. In particular, connector 100 may be fabricated from a solid metal wire with slots 112 and 122 being cut through the surface of the wire to the axis of the wire. The term "cut through" here refers to a description of a slot in the sense that a slot is a perforation that extends completely through the surface of the wire to the axis of the wire rather than referring to a processing step used to create the slot. Radial compression of connector 100 induces elastic flexure of legs 134, which flexure acts to elastically oppose a reduction of the diameter of connector 100. The radial compressibility of connector 100 may be much greater than the compressibility of an uncut wire of the same material and diameter as wire 102. In quantitative terms, where radial compressibility is defined as a fractional reduction ($\delta D/D$) in diameter D of connector 100 in response to a unit of radial pressure P, compressibility may be expressed as $\delta D/(D*P)$. In accordance with one or more embodiments, the compressibility of connector 100 may be orders of magnitude greater than the compressibility $(1-v)/E$ of the material of solid wire 102, i.e., $$\delta D/(D*P) \gg (1-v)/E \qquad (1)$$

where E is the elastic modulus and $v$ is the Poisson ratio of the material of the wire 102. By way of example, the elastic modulus of stainless steel (E)=$207\times10^9$ Pascal, and the Poission ratio $v$=0.29. One embodiment of a compliant connector had a radial compressibility of $4\times10^{-7}$ Pascal$^{-1}$, which radial compressibility was measured on actual samples and is much greater than the compressibility $3.4\times10^{-12}$ of a stainless steel wire. This is expressed as follows:

$$\delta D/(D*P)=4\times10^{-7} \gg (1-v)/E=3.4\times10^{-12} \qquad (2)$$

expressed in units of Pascal$^{-1}$. The radial compressibility of the body of the connector allows the entire length of the connector to be inserted into a mating hole of a diameter less than the uncompressed diameter D of the connector. Such compression is elastic, whereby the body of the connector urges against the cylindrical surface of a hole into which it is inserted. In practice, for a particular application, a person of ordinary skill in the art would fabricate an embodiment using the guidelines described above. The person could use finite element analysis to estimate the radial compressibility of the embodiment and/or the person could test the embodiment in use to determine whether it meets requirements for, for example, radial compressibility that makes it suitable for reliable connection in that particular application. As such, this methodology may involve some routine experimentation using the guidelines set forth herein.

FIG. 3B is a top view A-A' of connector 100 showing the top ends of four top segments 114 of top tines of connector 100. Top segments 114 are separated from one another by slots 112 extending from the cylindrical surface of wire 102 to the axis of wire 102. In accordance with one or more embodiments, slots 112 are cut through from the cylindrical surface of wire 102 to the axis of the wire by means, for example and without limitation, of an ablation laser. The ends of top segments 114 of top tines and the ends of bottom segments 124 of bottom tines may be tapered (for example and without limitation, to reduce the length and/or width), thinned or contoured to facilitate engagement with a mating hole.

In accordance with one or more embodiments, rasps may be formed near one or both ends of connector 100 to enhance mechanical and electrical engagement of the connector 100 to a mating hole (where near an end is a distance from the end such that $0.0 \le \text{distance} \le 0.20*L$, where L is the length of the connector). In accordance with one or more such embodiments, groove 118 disposed around the circumference of wire 102 (as shown in FIG. 3A) is a rasp disposed near an end of connector 100. In accordance with one or more embodiments, a rasp may comprise, for example and without limitation: (a) one or more circumferential grooves in the surface of wire 102; (b) a surface roughness etched into the surface of wire 102 near an end of wire 102; (c) a granular material deposited on the surface of wire 102 near an end of wire 102; or (d) asperities on the surface of wire 102 near an end of the wire 102 that are fabricated using any one of a number of methods that are known in the art for creating asperities. In addition, rasps may be fabricated in the same manner discussed above with respect to rasps 28 and 38.

FIG. 3C is a top sectional view B-B' through connector 100 showing rasp 118 and top segments 114 of top tines, which top segments 114 are separated from one another by slots 112 cut through wire 102 to the axis of wire 102, and which slots 112 extend from the top end of connector 100. FIG. 3D is a top sectional view C-C' of connector 100 showing: (a) slots 112 cut through connector 100 from the surface of wire 102 to the axis of the wire 102 and extending from the top end; (b) slots 122 cut through connector 100 from the surface of wire 102 to the axis of wire 102 and extending from the bottom end; and (c) legs 134 between slots 112 and 122. In accordance with one or more embodiments, the number of slots 112 may be 2, 3, 4, 5, 6, 7, 8 or more, depending upon the design of connector 100. In accordance with one embodiment like that shown in FIG. 3A, wire 102 has a diameter D of 0.3 mm, and slots 112 and 122 have a width of 0.05 mm. In accordance with one or more embodiments, the diameter D may be designed for any size of wire or rod, wherein the slot width is preferably between 0.025 and 0.25 times the wire diameter D. The guidelines for fabricating embodiments of wire-based connectors are the same as for hollow tube connectors, although solid, wire-based connectors would likely be appropriate to smaller diameters and dimensions.

A top sectional view C-C' through connector 100 in FIG. 3D shows 8 legs 134 formed by 4 slots 112 extending downward from the top end of connector 100, and 4 slots 122 extending upward from the bottom end of connector 100. In the embodiment shown in FIGS. 3A-3D, slots 112 and slots 122 are intercalated around the circumference of connector 100, whereby slot 122 is interposed between two slots 112. The slots 112 and 122 are oriented at an angle $\Theta$ with respect to the axis of connector 100, wherein angle $\Theta$ is preferably between 5° and 45°, and more preferentially between 10° and 35°.

Embodiments of connector 100 were made using stainless steel 17-7 cold work condition C wires having a diameter of 0.5 mm. The wire was tempered to condition 900° F. for one hour after the slots were formed (in accordance with one or more embodiments utilizing tubes fabricated of the same material, the tubes may also be tempered in the same manner after slots are formed). In accordance with one or more embodiments, the material of wire 102 may be selected, for example and without limitation, from a group of materials including stainless steel, phosphor bronze, beryllium-copper, tungsten, tungsten alloys, titanium alloys, Nitinol, diamond like carbon, and other spring-like materials. In accordance with one or more such embodiments, the wire may be plated with, for example and without limitation, a nickel strike of about 1.5 microns thickness, a layer of cobalt-copper alloy, and a layer of hard gold of about 0.5 microns thickness. One skilled in the art will be familiar with commonly available plating materials and thicknesses that may be used to improve the electrical conduction of connector 100.

Figure 4A:
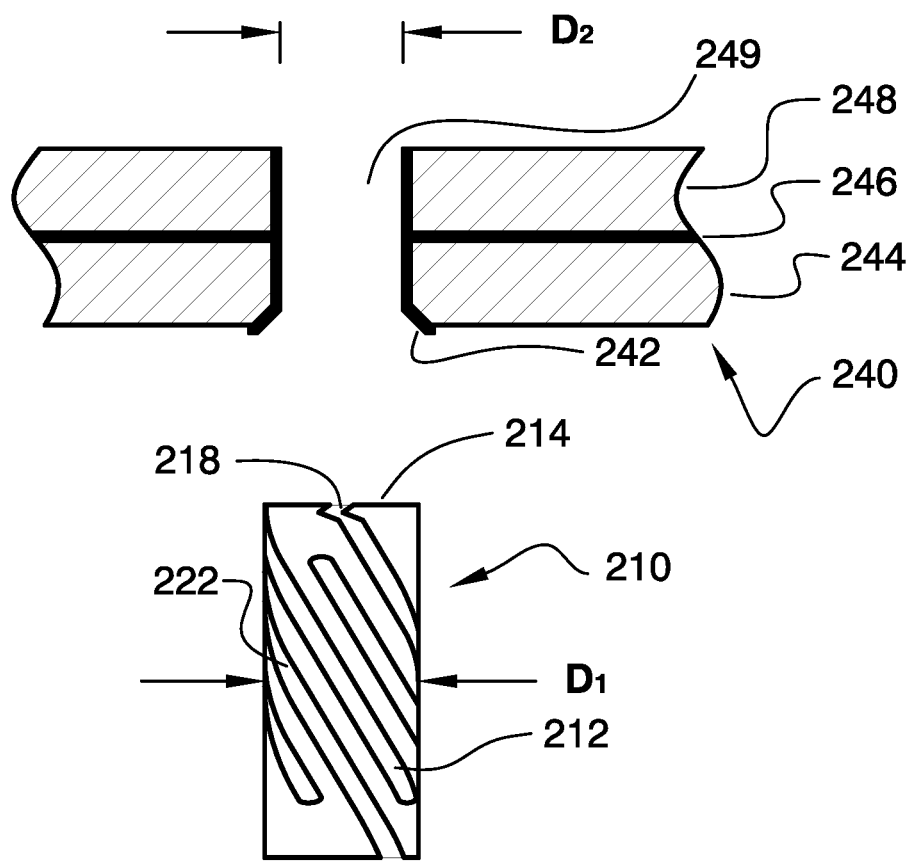
FIG. 4A shows partial sectional view of a tubular connector that is fabricated in accordance with one or more embodiments juxtaposed to a first circuit board having a metal plated hole, which metal plated hole is in axial alignment with the tubular connector.
Figure 4B:
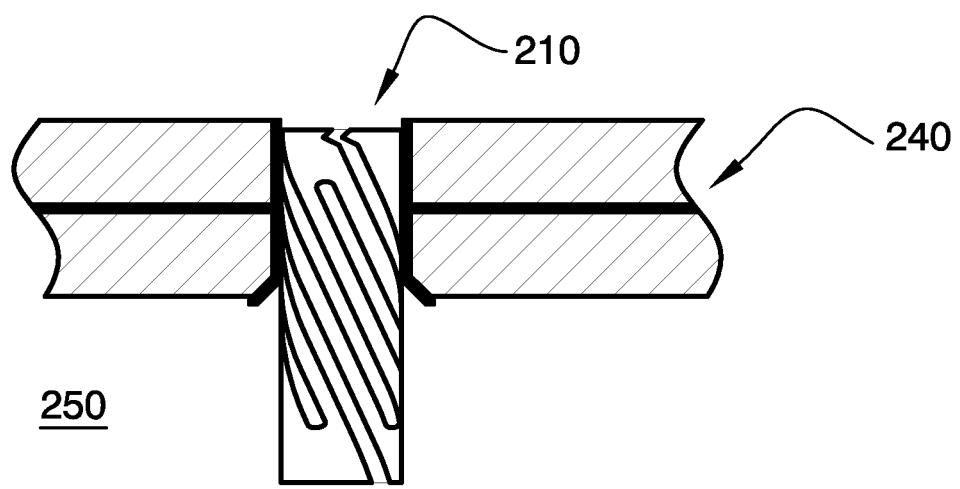
FIG. 4B shows a partial sectional view of a packaging assembly comprising a tubular connector engaged in a metal plated hole in a first circuit board.

A radially compressible connector may be incorporated into a wiring substrate of a microelectronic package, thereby providing a pluggable contact on the package. FIGS. 4A and 4B show partial sectional views of: (a) connector 210 that is fabricated in accordance with one or more embodiments juxtaposed to circuit board 240 having metal plated hole 249, which metal plated hole 249 is in axial alignment with connector 210; and (b) assembly 250 wherein connector 210 is engaged in metal plated hole 249 in circuit board 240, respectively. Connector 210, having an initial, uncompressed diameter D1, is retained in mating hole 249, having a diameter D2, by elastic forces urging the surface of connector 210 against the internal surface of mating hole 249. A bottom end of mating hole 249 is chamfered and plated with a thin metal layer 242, for example and without limitation, a copper layer, to provide easy insertion of connector 210 into mating hole 249. In accordance with one or more further embodiments, in addition to or to obviate the need for the chamfer, an end of connector 210 to be inserted into mating hole 249 may be shaped, for example and without limitation, by reducing the diameter of its outer surface, so as further enable insertion. Mating hole 249 may be plated using any one of a number of methods known to those of ordinary skill in the art. For example and without limitation, one method entails: (a) forming a seed layer (for example, a copper seed layer) on the surfaces of chamfered hole 249; and (b) plating a thin layer of copper (for example and without limitation, about 10 to 20 microns thick) on the chamfered hole by an electrolytic process or by an electroless process. The copper may then be protected by plating a 1.0-2.0 micron thick layer of nickel and then a 0.5-1.0 micron thick layer of hard gold. The hard gold layer on the nickel layer provides an oxide free contact surface for good contact over many mating cycles of the connector. Hard gold may be plated using any one of a number of methods for producing alloys of gold with, for example and without limitation, chrome, cobalt, nickel, iron, or silicon.

In order to elastically compress connector 210 and retain connector 210 in mating hole 249, diameter D1 of uncompressed connector 210 is greater than diameter D2 of mating hole 249, i.e., D1>D2; D1 is preferably between (1.05×D2) and (1.35×D2). In accordance with one or more embodiments, D1=0.5 mm and D2=0.45 mm. In accordance with one or more such embodiments, further means for retaining connector 210 in mating hole 249 is provided by rasps 218 formed in the slots 212 on the edge of tine 214. Preferably, rasps are provided near a first end of connector 210, which first end is adapted to be retained permanently in mating hole 249.

In accordance with one or more embodiments, assembly 250 of FIG. 4B is a microelectronic package having one or more connectors 210 adjoined thereto. Connectors 210 act as mechanically compliant contacts on assembly 250 that provide stress relief between assembly 250 and a next level of interconnect. In accordance with one or more such embodiments, connector 210 is connected electrically to trace 246 (for example and without limitation, a copper trace) by plating (for example and without limitation. copper plating) on the internal surface of mating hole 249. As shown in FIGS. 4A and 4B, traces 246 are insulated by dielectric layers 244 and 248 of circuit board 240. As such, connectors 210 provide an interconnection mechanism for connecting packaged microelectronics to a next level of integration. The interconnection mechanism may be temporary, as in a socket, or permanent, as in an electronics assembly. In accordance with one or more such embodiments, an array of connectors 210 may be utilized to retain mechanically a microelectronic device to a mating circuit board without the need for a clamping mechanism, a socket, solder joints, a conductive polymer, a laser weld or other conventional interconnection mechanisms.

Figure 4C:
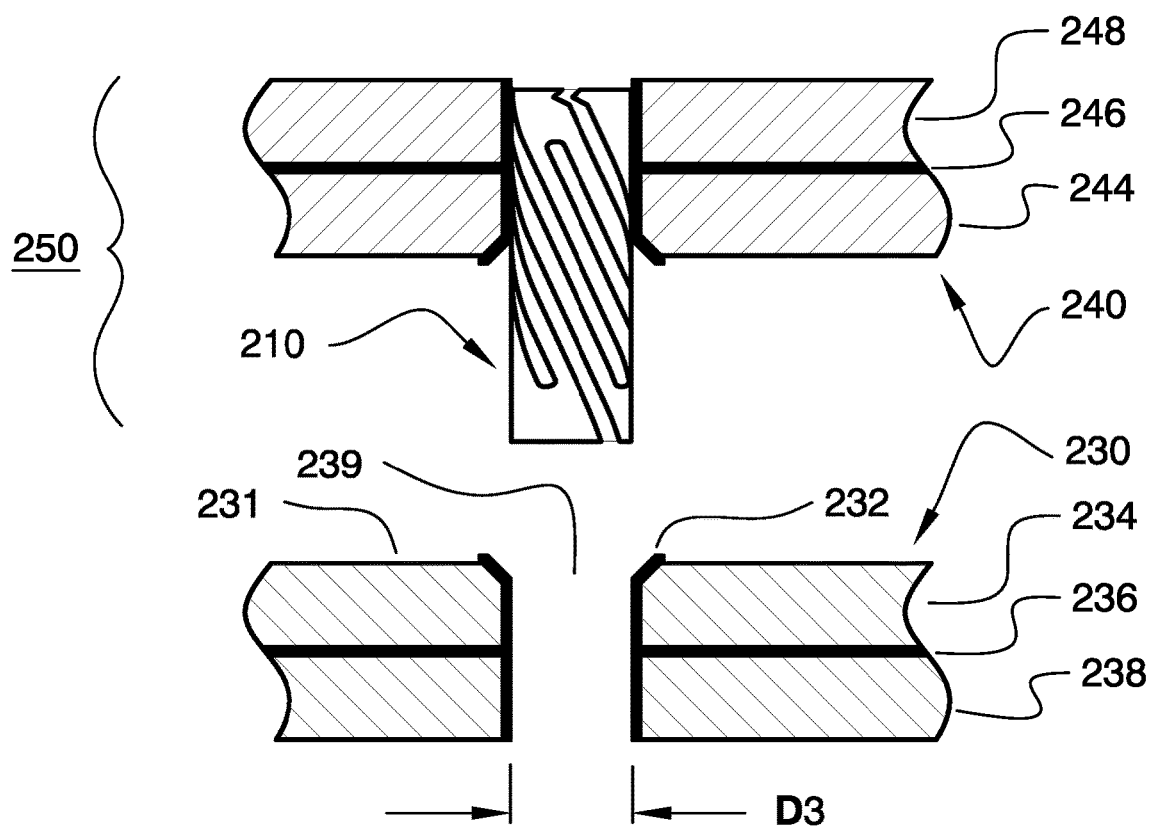
FIG. 4C shows a partial sectional view of a second circuit board juxtaposed to a packaging assembly, which packaging assembly comprises a tubular connector disposed in a metal plated hole in a first circuit board.
Figure 4D:
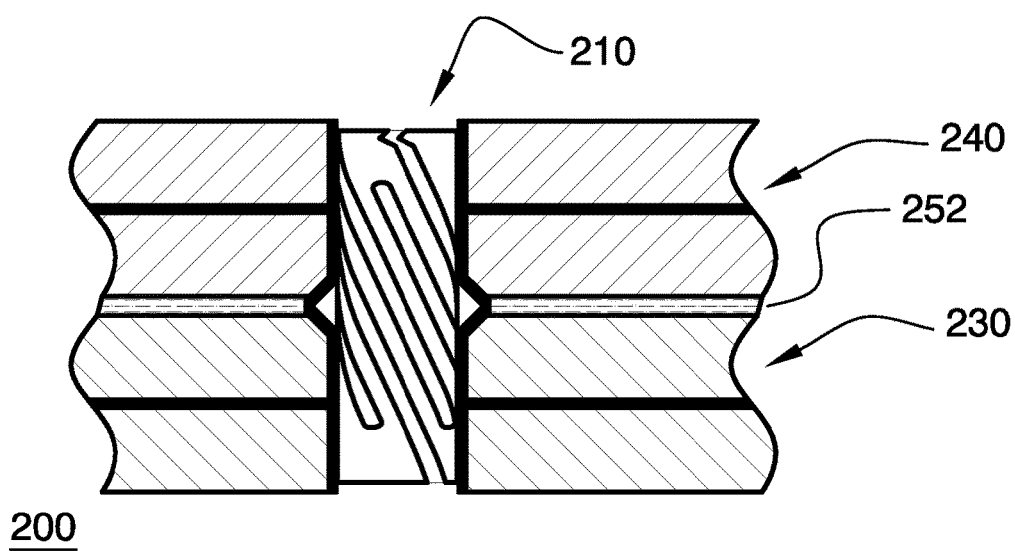
FIG. 4D shows a partial sectional view of a first and a second circuit board interconnected mechanically and electrically by a cylindrical connector.

Microelectronic assembly 250 shown in FIG. 4B may be joined to a mating circuit board as illustrated in FIGS. 4C and 4D. The partial cross sectional view of FIG. 4C shows assembly 250 juxtaposed to circuit board 230 wherein connector 210 is in vertical alignment with mating, metal plated, hole 239 in circuit board 230. Connector 210 is held in mating hole 239 of microelectronic circuit 230 (refer to FIG. 4D) by an elastic force due to compression of connector 210 by the interior diameter D3 of hole 239; and by engagement of rasps disposed in the slots on the edge of tines near the bottom of connector 210 with metal plating 232 of mating hole 239. A top end of hole 239 is chamfered and plated with thin metal layer 232, for example and without limitation, a copper layer, to provide easy insertion of connector 210 into mating hole 239. In accordance with one or more further embodiments, in addition to or to obviate the need for the chamfer, an end of connector 210 to be inserted into mating hole 239 may be shaped, for example and without limitation, by reducing the diameter of its outer surface, so as further enable insertion. In order to elastically compress connector 210 and retain connector 210 in mating hole 239, diameter D1 of uncompressed connector 210 is greater than diameter D3 of mating hole 239, i.e., D1>D3. Copper layer 232 is electrically connected to copper trace 236 of circuit board 230, wherein trace 236 is insulated by layers 234 and 238 of circuit board 230.

In these descriptions the term circuit board is intended to include, among others, circuit boards of various types. In accordance with one or more embodiments, circuit boards 230 and 240 are selected from a group including without limitation a printed circuit board, an electronic cable, a ceramic substrate, a multi-chip module, an IC package, a semiconductor device, a connector body, and the like.

FIG. 4D shows a partial sectional view of microelectronic assembly 250 after being mounted to circuit board 230, thereby forming assembly 200. FIGS. 4A-4D show only one connector 210 of assembly 200 for simplicity of exposition, whereas an assembly, for example and without limitation, a microelectronic device, may incorporate a plurality of connectors. When mated, connector 210 electrically connects copper circuit trace 246 of circuit board 240 to copper circuit trace 236 of circuit board 230. The separation between circuit board 240 and circuit board 230 in assembly 250 can be reduced to a negligible distance, depending upon design requirements. In addition, the space between the circuit boards may be sealed by dielectric layer 252 selected from a group including without limitation silicone, epoxy, thermoplastic adhesive, acrylic polymer, silicone pressure sensitive adhesives, elastomeric gaskets, and similar materials. Alternatively, a temporary seal between circuit board 230 and circuit board 240 may be made by a grease such as silicone vacuum grease, Apiezon vacuum grease, petroleum based grease, or the like. An adhesive may be applied to a surface of circuit board 230 before mating, or alternatively, the adhesive may be introduced in the space between assembly 250 and circuit board 230 by well-known means including underfill, autoclave impregnation, pressure injection and the like.

The two circuit boards 230 and 240 are joined by connectors 210, wherein elastic compression urges connector 210 against the metal surface 242 of mating hole 249, and by elastic compression against the metal surface 232 of mating hole 239. An adhesive material 252 may be used to seal permanently one circuit board 230 to the other 240.

Referring to FIG. 4D where tubular connector 210 joins circuit board 230 to circuit board 240, it is contemplated that further embodiments exist where the distance between the mating surfaces of circuit board 230 and circuit board 240 is insignificant and, in a limiting case, this distance can be made to be zero. We can refer to such embodiments as "low file" embodiments. Such low profile embodiments provide advantages over the prior art where a connector interposed between a first and a second circuit board increases the spacing between mating surfaces of the boards. A first advantage accrues from a reduction in height of an assembly of a first and a second circuit board. This reduction in height allows thinner personal electronics products. A second advantage accrues from a reduction in the distance between a circuit in a first circuit board and a mating circuit in a second circuit board. Namely, by reducing the distance that electrical signals travel between a circuit and a mating circuit, the connector allows the circuits to operate at higher frequencies, thereby increasing performance of the circuits.

Assembly 250 may be detached from circuit board 230 by urging circuit board 240 away from circuit board 230 by means of a mechanical clamp or a vacuum chuck. Detachment may be facilitated by vibrating circuit board 240 relative to circuit board 230. Similarly, insertion of assembly 250 onto circuit board 230 may be facilitated by vibration. Facilitating vibration includes sonication, ultrasonic agitation, circularly polarized vibration, and the like.

Although embodiments described above referred to interconnecting microelectronic devices, further embodiments are not thusly limited. In fact, it is contemplated that one or more embodiments may be used to connect to a body to another body, preferably in the form of sheets such as, for example and without limitation, planar sheets. For example, snap-together furniture, enclosures, toys, electronic systems, etc. The snap together assemblies can be disassembled, where the force to disassemble can be greater than the force needed to assemble them, depending upon the design of the connector.

Embodiments described above are exemplary. As such, many changes and modifications may be made to the description set forth above by those of ordinary skill in the art while remaining within the scope of the invention. In addition, materials, methods, and mechanisms suitable for fabricating embodiments have been described above by providing specific, non-limiting examples and/or by relying on the knowledge of one of ordinary skill in the art. Materials, methods, and mechanisms suitable for fabricating various embodiments or portions of various embodiments described above have not been repeated, for sake of brevity, wherever it should be well understood by those of ordinary skill in the art that the various embodiments or portions of the various embodiments could be fabricated utilizing the same or similar previously described materials, methods or mechanisms. As such, the scope of the invention should be determined with reference to the appended claims along with their full scope of equivalents.

What is claimed is:

1. A connector adapted to connect to a hole in a body comprising:
    a hollow tube of a length L as measured along an axis of the tube;
    a plurality of first slots disposed around a circumference of the connector and being cut through a wall of the tube, the first slots (a) extend from a first end of the tube along helical curvilinear paths partway toward a second end of the tube, (b) are helical paths of uniform first angle with respect to the axis of the tube, and (c) are of uniform width from end-to-end; and
    a plurality of second slots disposed around the circumference of the connector and being cut through the wall of the tube, the second slots (a) extend from the second end of the tube along helical curvilinear paths partway toward the first end of the tube, (b) are helical paths of uniform second angle with respect to the axis of the tube, and (c) are of uniform width from end-to-end;
    wherein the first slots are intercalated between the second slots to form a plurality of legs disposed therebetween; and
    the first angle is the same as the second angle so that the legs are of uniform width.

2. The connector of claim 1 wherein the first slots and the second slots extend for a distance of between 0.65 L and 0.98 L as measured along the axis of the tube; and
    the first angle and the second angle are between 5° and 45° with respect to the axis of the tube.

3. The connector of claim 2 wherein the tube further comprises a rasp disposed near a first and/or a second end of the tube.

4. The connector of claim 3 wherein the rasp comprises one or more grooves disposed around a circumference of the tube.

5. The connector of claim 1 wherein the tube is electrically conductive.

6. The connector of claim 1 wherein the tube is comprised of a metal selected from the following: stainless steel, beryllium copper, phosphor bronze, Nitinol, a tungsten alloy, a titanium alloy, and a spring steel.

7. The connector of claim 1 wherein the first slots comprise between 3 and 8 slots.

8. A connector adapted to connect to a hole in a body comprising:
    a hollow tube of a length L as measured along an axis of the tube;
    a plurality of slots of a first group cut through a wall of the tube, the slots of the first group extending from a first end of the tube along curvilinear paths partway toward a second end of the tube; and
    a plurality of slots of a second group cut through the wall of the tube, the slots of the second group extending from the second end of the tube along curvilinear paths partway toward the first end of the tube;
    wherein slots of the first group are intercalated between slots of the second group;
    wherein the tube further comprises a rasp disposed near a first and/or a second end of the tube; and
    wherein the rasp comprises a saw-tooth pattern having at least one tooth disposed along a slot.

9. A connector adapted to connect to a hole in a body comprising:
    a cylindrical wire of length L as measured along an axis of the wire;
    a plurality of first slots disposed around a circumference of the connector and being cut through a cylindrical surface of the wire to the axis, the first slots (a) extend from a first end of the wire along helical curvilinear paths to a distance L1 from the first end as measured along the axis, (b) are helical paths of uniform first angle with respect to the axis of the wire, and (c) are of uniform width from end-to-end;

a plurality of second slots disposed around a circumference of the connector and being cut through the cylindrical surface to the axis, the second slots (a) extend from a second end of the wire along helical curvilinear paths to a distance L2 from the second end as measured along the axis, (b) are helical paths of uniform second angle with respect to the axis of the wire, and (c) are of uniform width from end-to-end;

wherein the first slots are intercalated between the second slots to form a plurality of legs disposed therebetween;

L1 is between 0.65 and 0.98 times L;

L2 is between 0.65 and 0.98 times L; and the first angle is the same as the second angle so that the legs are of uniform width.

10. The connector of claim 9 wherein the first angle and the second angle are between 5° and 45° with respect to the axis.

11. The connector of claim 9 wherein the wire further comprises a rasp disposed near a first and/or a second end of the wire.

12. A microelectronic device with one or more mechanically compliant connectors for contacting a mating circuit board; the device comprising:

a circuit board having one or more holes disposed therein and opening at a first surface, which holes are plated with a layer of metal; and one or more cylindrical connectors having (a) a plurality of proximal slots extending in helical curvilinear paths from a proximal end, and (b) a plurality of distal slots extending in helical curvilinear paths from a distal end;

wherein the proximal slots and the distal slots are intercalated over a portion of the connectors;

wherein proximal ends of the one or more cylindrical connectors are disposed in the holes so that: (a) distal ends of the connectors protrude from the first surface, (b) an internal surface of the hole contacts an outer surface of the connector, and (c) a diameter of the hole and an outer diameter of the connector is such that the connector is retained in the hole by elastic forces provided by the connector which urge the outer surface of the connector against the internal surface of the hole.

13. The microelectronic device of claim 12 wherein the proximal slots of the connectors cut through outer surfaces of the connectors to axes of the connectors in helical paths extending between 65% and 98% along the length of the connectors.

14. The microelectronic device of claim 13 wherein the one or more cylindrical connectors comprises a hollow tube and wherein the proximal slots and the distal slots cut through a wall of the cylindrical connector.

15. The microelectronic device of claim 13 wherein the one or more cylindrical connectors comprises a solid wire wherein the proximal slots and the distal slots cut through from the surface of the wire to the axis of the wire.

16. An assembly wherein one or more connectors interconnect circuits in a first electronic device to corresponding circuits in a second electronic device, the assembly comprising:

a first electronic device with one or more holes of diameter D2 disposed on a first surface;

a second electronic device with one or more holes of diameter D3 disposed on a second surface;

one or more conductive cylindrical connectors of uncompressed diameter D1 wherein a plurality of distal slots extending in helical curvilinear paths from a distal end along the cylindrical connector, and a plurality of proximal slots extending in helical curvilinear paths from a proximal end along the cylindrical connector;

wherein the distal slots and the proximal slots are intercalated over a portion of the connectors; and wherein the distal ends of the one or more connectors are held in the one or more holes in the first surface by elastic forces provided by the connector which urge an outer surface of the distal end against an internal surface of the hole, and the proximal ends of the one or more connectors are held in the one or more holes in the second surface by elastic forces provided by the connector urge an outer surface of the proximal end against an internal surface of the hole.

17. The assembly of claim 16 wherein D1>D2≥D3.

18. The assembly of claim 16 wherein the first electronic device is an integrated circuit package.

19. The assembly of claim 16 wherein the first electronic device is a circuit board, the second electronic device is a circuit board and a dielectric material is interposed between the first circuit board and the second circuit board.

20. The assembly of claim 19 wherein the dielectric material is an adhesive selected from a group including silicone, acrylic polymer, epoxy, pressure sensitive adhesive, thermoplastic polyimide, and thermoplastic resins.

* * * * *